United States Patent [19]

Bose

[11] Patent Number: 5,034,984
[45] Date of Patent: Jul. 23, 1991

[54] SPEED-CONTROLLED AMPLIFYING

[75] Inventor: Amar G. Bose, Wayland, Mass.

[73] Assignee: Bose Corporation, Framingham, Mass.

[21] Appl. No.: 303,993

[22] Filed: Jan. 27, 1989

Related U.S. Application Data

[63] Continuation of Ser. No. 465,818, Feb. 14, 1983, abandoned.

[51] Int. Cl.$^5$ .............................................. H04B 1/16
[52] U.S. Cl. ...................................... 381/86; 381/107; 455/238
[58] Field of Search ........................ 381/56, 57, 58, 94, 381/86, 103, 104, 105, 107106; 455/238

[56] References Cited

U.S. PATENT DOCUMENTS

| | | | |
|---|---|---|---|
| 2,080,554 | 5/1937 | Wolff | 455/238 |
| 2,270,789 | 1/1942 | Smith | 455/238 X |
| 3,233,178 | 2/1966 | Byles | 455/238 |
| 4,076,959 | 2/1978 | Gilbert et al. | 381/101 X |
| 4,476,571 | 10/1984 | Tokumo et al. | 381/57 |

FOREIGN PATENT DOCUMENTS 658105  10/1951  United Kingdom ............... 455/238

Primary Examiner—James L. Dwyer
Attorney, Agent, or Firm—Fish & Richardson

[57] ABSTRACT

A variable gain amplifier receives an input electrical audio signal and has its gain controlled by a vehicle speed signal representative of the vehicle speed. The signal provided by the variable gain amplifier is coupled to a manually set volume control that is coupled to a power amplifier that drives a loudspeaker. According to a specific form of the invention the manually set volume control is an element in a dynamic equalization circuit that alters the equalization in the bass frequency region typically below 200 Hz in accordance with the setting of the control to provide more boost at lower settings of the volume control.

1 Claim, 2 Drawing Sheets

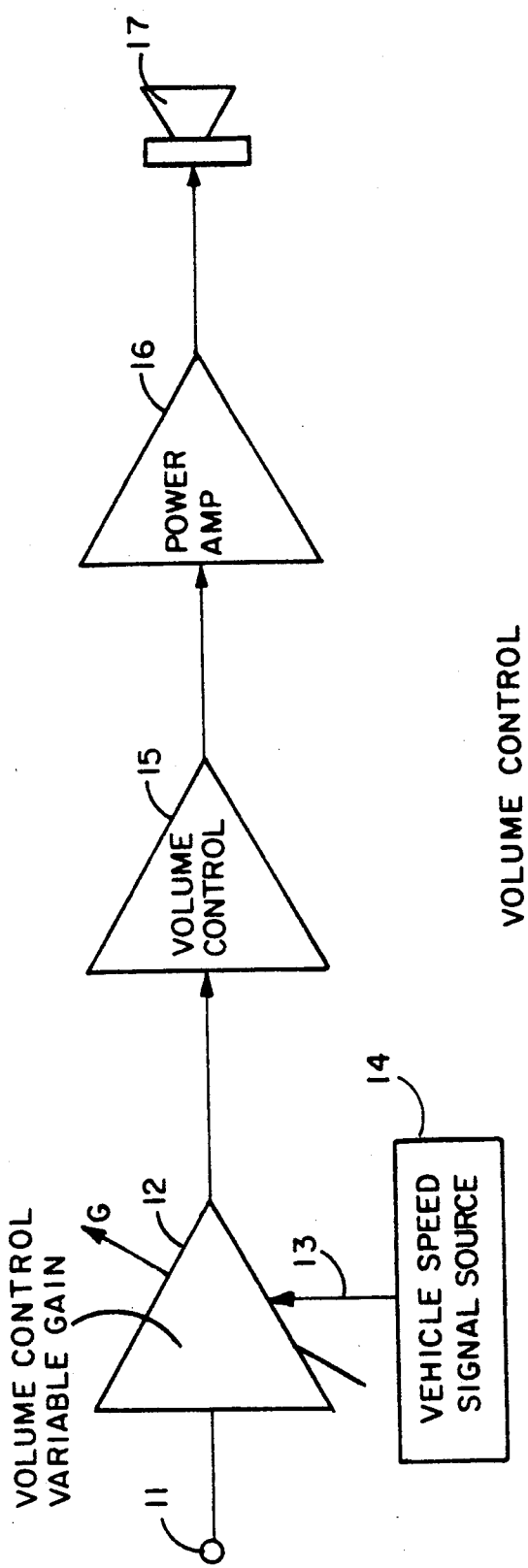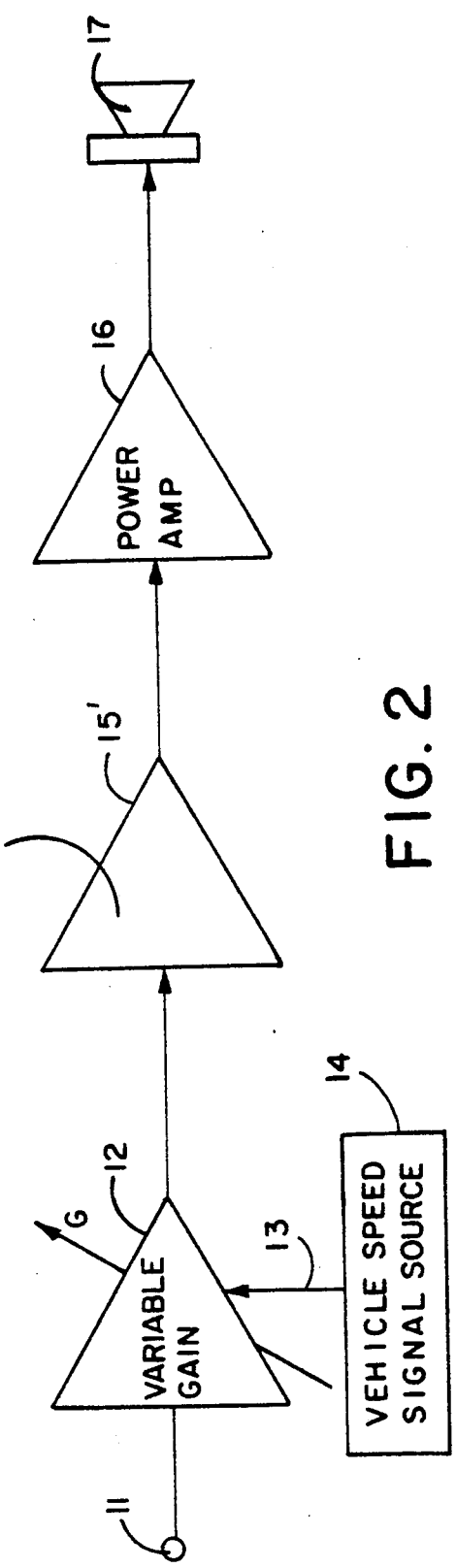

5,034,984

SPEED-CONTROLLED AMPLIFYING

This is a continuation of Ser. No. 465,818 filed Feb. 14, 1983, now abandoned.

BACKGROUND OF THE INVENTIONS

The present invention relates in general to controlling sound level automatically in a vehicle and more particularly concerns novel apparatus and techniques for automatically controlling the sound level in a vehicle relatively inexpensively and with relatively little apparatus by taking advantage of the discovery that the noise level in a vehicle generally increases with the vehicle speed.

It is known that a listener to sound reproduced in a vehicle requires more volume to maintain the same perceived sound level as the noise level in the vehicle increases because the noise masks the desired reproduced sound. Thus, the listener typically must manually increase and decrease the volume as the noise level in the vehicle changes. One prior art approach for attempting to overcome this problem involves locating a microphone in the vehicle, processing the signal transduced by the microphone to provide a signal related to the noise level in the vehicle and altering the volume in accordance with the signal representative of the noise level. This approach has a number of problems. It is costly. In order to avoid oscillation the system must measure noise outside the spectrum of the audio signals being reproduced. Thus noises that do not mask signals may cause the volume to increase.

SUMMARY OF THE INVENTION

Accordingly, it is an important object of this invention to provide a volume control for a vehicle sound amplification system that automatically changes volume in the vehicle in a manner that allows the listener therein to perceive a substantially constant volume level.

According to the invention, in a vehicle sound amplification system, there is a source of a speed signal representative of the vehicle speed, and variable gain means with gain responsive to the vehicle speed signal for altering the gain in the sound amplifying means in accordance with vehicle speed. According to another aspect of the invention, the sound amplification means includes dynamic equalization means cascaded with the variable gain means so that the equalization response associated with the manually set volume remains the same in the presence of variable gain caused by variations in vehicle speed.

Stated in other words, the dynamic equalization circuit means provides a predetermined boost over the bass frequency range relative to the mid frequency range depending on the setting of a manually set volume control with the magnitude of that boost directly related to the manually set attenuation furnished by the volume control, and there is means for intercoupling the signal of controlled amplitude with the volume control whereby the predetermined boost is independent of the vehicle speed to significantly increase the gain of the system at low frequencies relative to other frequencies to mask low frequency vehicle noise which low frequency vehicle noise is a function of vehicle speed with the magnitude of the boost for a particular vehicle speed being that manually selected for a quiet environment providing the same subjective sound level in the quiet environment then being provided at that particular vehicle speed in the noisy environment. In other words, as vehicle ambient noise increases with increasing vehicle speed and the sound reproduction level in the vehicle is increased to maintain the same subjective level, the equalization response is not that which belongs to the higher sound reproduction level when listening in a quiet environment, but instead it is equal to the equalization response for the lower volume level in the quiet environment that existed before the ambient noise increased with increasing vehicle speed.

Numerous other features, objects and advantages of the invention will become apparent from the following specification when read in connection with the accompanying drawing in which:

BRIEF DESCRIPTION OF THE DRAWINGS

FIG. 1 is a block diagram illustrating the logical arrangement of a system according to the invention;

FIG. 2 is a block diagram illustrating the logical arrangement of a system according to the invention having dynamic equalization in accordance with the invention in pending U.S. application Ser. No. 388,097 filed June 14, 1982 now U.S. Pat. No. 4,490,843, embodied in the commercially available Delco-GM-Bose music system;

DESCRIPTION OF THE PREFERRED EMBODIMENTS

Figure 3:
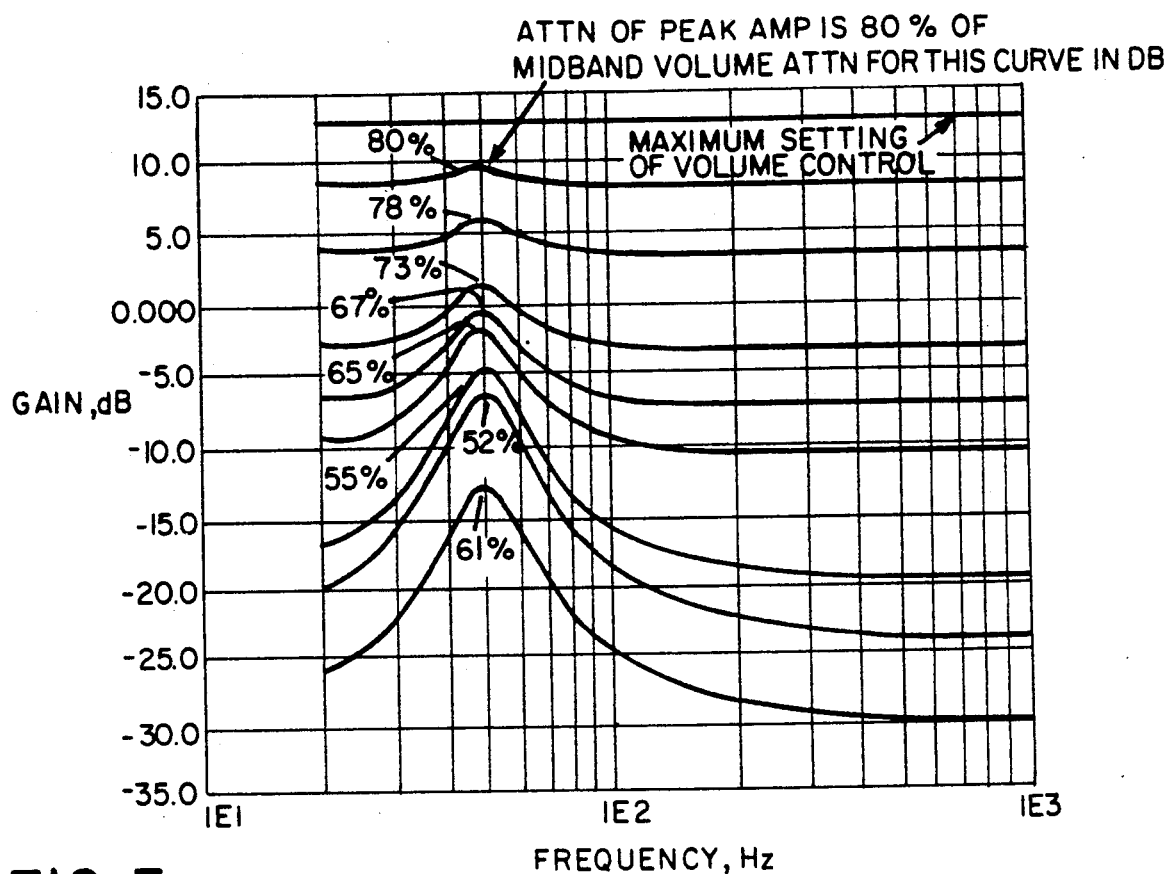
FIG. 3 is a graphical representation of dynamic equalization for different manual settings of volume controls in accordance with the invention in said pending application.

With reference now to the drawing and more particularly FIG. 1 thereof, there is shown a block diagram illustrating the logical arrangement of a system according to the invention. An electrical audio input signal on terminal 11, such as provided by a tuner or tape player, is applied to variable gain amplifier 12 having its gain controlled by a vehicle speed signal source on line 13 provided by vehicle speed signal source 14. Source 14 may comprise the source that provides the electrical signal to a digital speedometer display or other suitable source of a vehicle speed signal, such as the source of the vehicle speed signal available in an automatic speed control system. Alternatively, the vehicle speed signal source may comprise a D.C. generator driven by an axle or drive shaft. As a further alternative, the vehicle speed signal source may comprise one or more permanent magnets affixed to the drive shaft or an axle that pass by a stationary pickup winding to produce a signal of frequency proportional to vehicle speed. This signal may be applied to a circuit that provides a potential proportional to vehicle speed. The output signal from variable gain circuit 12 is applied to volume control 15 that is manually adjusted by a listener in the vehicle and then delivered to power amplifier 16. The output of power amplifier 16 is applied to loudspeaker 17.

Operation is as follows. The listener sets volume control 15 for a desired sound level in the vehicle. As the vehicle increases its speed, the vehicle speed signal on line 13 increases to thereby increase the gain of variable gain amplifier 12 and maintain the sound level perceived by the listener unchanged. When the vehicle stops, such as at a toll booth or at a stop light, the gain of variable gain amplifier 12 decreases accordingly, and the listener perceives substantially the same sound level as when the vehicle is moving. Sound level does not change in the presence of sudden bursts of noise, for example, when passing a truck.

Referring to FIG. 2, there is shown a block diagram illustrating the logical arrangement of a preferred system according to the invention incorporating the dynamic equalization embodied in the commercially available Delco-GM-Bose music system and described in copending U.S. application Ser. No. 388,097 filed June 14, 1982. The same reference symbols identify corresponding elements throughout the drawing. The system of FIG. 2 is the same as the system of FIG. 1 except volume control with dynamic equalization circuit 15' is substituted for volume control 15. This circuit may comprise any of the circuits disclosed in FIGS. 2, 3 or 4 in the aforesaid copending U.S. application or loudness controls. The present invention has unobvious advantages when coacting with a circuit according to that invention.

Referring to FIG. 3, there is shown a graphical representation of equalization introduced for different volume control settings of a typical volume control with dynamic equalization circuit 15' corresponding to that in FIG. 6 of the aforesaid copending application. Consider a situation in which the listener in the vehicle at rest has set the volume control for a setting corresponding to the 55% curve. Now as the vehicle speed increases, this equalization response remains unchanged for a higher volume level. The effect of this is to provide more bass for this higher volume level than would be obtained if the higher volume level were created by manually increasing the setting of the volume control. This compensates for the fact that the noise in the vehicle is predominantly at the low frequencies and thus it masks the low frequencies more than it masks the mid and high frequencies. The listener continues to perceive substantially the same level of reproduced bass signal components that the listener perceives when the vehicle is stationary. Thus, the invention in this embodiment overcomes a disadvantage observed by listeners in vehicles that the perceived bass response decreases with increasing vehicle speed. This aspect of the invention provides a listener in the vehicle with substantially the same perception of bass/midrange ratio of spectral components of reproduced sound independently of vehicle speed.

Figure 4:
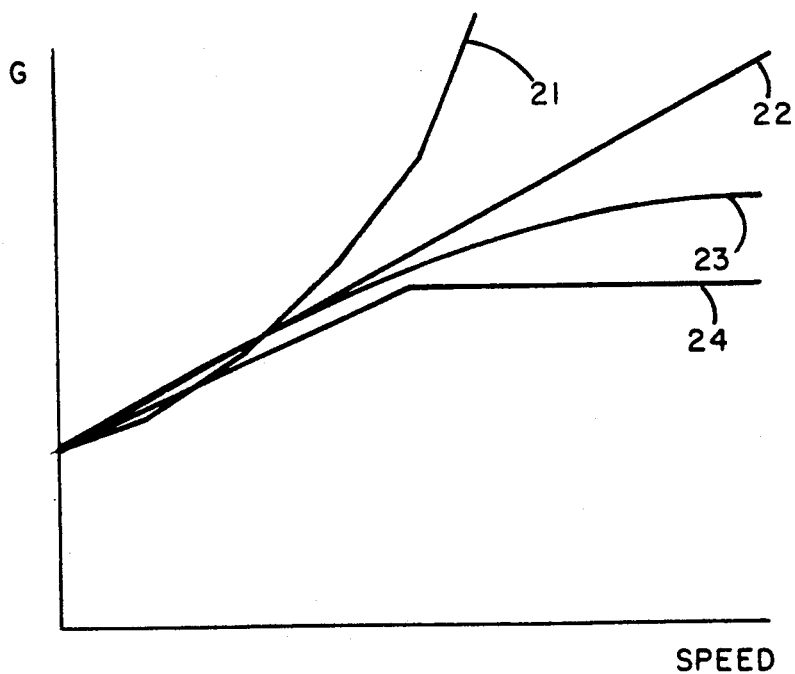
FIG. 4 is a graphical representation of various gains as a function of speed that may be embodied in the invention.

Referring to FIG. 4, there is shown a graphical representation of typical curves which may be desirable for gain as a function of speed for variable gain amplifier 12. Curve 21 increases as a function of speed to a power greater than one, curve 22 is a linear function of speed. In curve 23 gain increases as a function of speed that is a power less than one. For curve 24 gain increases proportional to speed up to a predetermined maximum speed when the gain remains constant. Numerous other forms of the gain-speed curve may be practiced by those skilled in the art for particular applications within the principles of the invention.

There has been described novel apparatus and techniques for maintaining the perceived sound level in a vehicle sound amplification system at a constant level selected by the operator independent of the speed of the vehicle. Also described is novel apparatus for maintaining the perceived spectral balance of the reproduced sound independent of speed of the vehicle and independent of the volume setting. It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. In a vehicle sound amplifying system having a manually operable volume control means for establishing the sound level of a desired signal in said vehicle, a power amplifier and electroacoustical transducing means, the improvement comprising, a source of a vehicle speed signal representative of the vehicle speed, variable gain means cascaded with said volume control means and responsive to an input electrical audio signal to be amplified by said system for providing a signal of controlled amplitude, said variable gain means being responsive to said vehicle speed signal for controlling the magnitude of said controlled amplitude to be related directly to said vehicle speed, said volume control means comprising dynamic equalization circuit means for providing a predetermined boost over the bass frequency range relative to the mid frequency range depending on the setting of a manually set volume control with the magnitude of said boost directly related to the manually set attenuation furnished by said volume control means, and means for coupling said signal of controlled amplitude to said volume control means whereby said predetermined boost is independent of said vehicle speed to significantly increase the gain of said system at low frequencies relative to other frequencies to mask low frequency vehicle noise which low frequency vehicle noise is a function of vehicle speed with the magnitude of said boost for a particular vehicle speed being that manually selected for a quiet environment providing the same subjective sound level in the quiet environment then being provided at that particular vehicle speed in the noisy environment.

* * * * *